(12) United States Patent
Senoo et al.

(10) Patent No.: US 10,163,890 B2
(45) Date of Patent: Dec. 25, 2018

(54) SEMICONDUCTOR DEVICE (71) Applicant: TOYOTA JIDOSHA KABUSHIKI KAISHA, Toyota-shi, Aichi-ken (JP)

(72) Inventors: Masaru Senoo, Okazaki (JP); Masanori Miyata, Kariya (JP)

(73) Assignee: TOYOTA JIDOSHA KABUSHIKI KAISHA, Toyota-shi (JP)

( * ) Notice: Subject to any disclaimer, the term of this patent is extended or adjusted under 35 U.S.C. 154(b) by 0 days.

(21) Appl. No.: 15/868,527

(22) Filed: Jan. 11, 2018

(65) Prior Publication Data

US 2018/0240792 A1 Aug. 23, 2018

(30) Foreign Application Priority Data

Feb. 23, 2017 (JP) ................. 2017-032269

(51) Int. Cl.
| | |
|---|---|
| *H01L 23/58* | (2006.01) |
| *H01L 29/10* | (2006.01) |
| *H01L 27/02* | (2006.01) |
| *H01L 29/739* | (2006.01) |
| *H01L 49/02* | (2006.01) |
| *H01L 23/00* | (2006.01) |
| *H01L 29/861* | (2006.01) |

(52) U.S. Cl.
CPC .......... *H01L 27/0255* (2013.01); *H01L 24/05* (2013.01); *H01L 24/45* (2013.01); *H01L 28/20* (2013.01); *H01L 29/7395* (2013.01); *H01L 29/861* (2013.01); *H01L 2224/04042* (2013.01)

(58) Field of Classification Search
USPC ............ 257/48, E21.388–E21.393, E21.614, 257/E21.677, E31.065–E31.066, E29.338, 257/E27.04, E27.068, 135–136, 242, 329; 438/30, 48, 128, 149, 151, 157, 161, 283
See application file for complete search history.

(56) References Cited

U.S. PATENT DOCUMENTS

| | | | | |
|---|---|---|---|---|
| 5,563,435 A | * | 10/1996 | Kohno ................ | H01L 27/0248 257/139 |
| 2016/0036433 A1 | | 2/2016 | Toshiyuki et al. | |
| 2016/0241242 A1 | | 8/2016 | Toshiyuki | |
| 2017/0236908 A1 | * | 8/2017 | Naito .................... | G01K 13/00 257/48 |

FOREIGN PATENT DOCUMENTS

| | | |
|---|---|---|
| JP | 2014-216932 A | 11/2014 |
| JP | 2016-149715 A | 8/2016 |

* cited by examiner

*Primary Examiner* — Tram H Nguyen
(74) *Attorney, Agent, or Firm* — Hunton Andrews Kurth LLP (57) ABSTRACT

A semiconductor device provided herein includes: a semiconductor substrate; an upper main electrode located above the semiconductor substrate; a sense anode electrode located above the semiconductor substrate; a first resistance layer located above the semiconductor substrate, having resistivity higher than resistivities of the upper main electrode and the sense anode electrode, and connecting the upper main electrode and the sense anode electrode; and a lower main electrode located below the semiconductor substrate. The semiconductor substrate includes a switching element and a sense diode. The switching element is connected between the upper main electrode and the lower main electrode. The sense diode includes a p-type first anode region connected to the sense anode electrode and an n-type first cathode region connected to the lower main electrode.

13 Claims, 12 Drawing Sheets

SEMICONDUCTOR DEVICE

CROSS-REFERENCE TO RELATED APPLICATION

The present application claims priority to Japanese Patent Application No. 2017-032269 filed on Feb. 23, 2017, which is incorporated herein by reference in its entirety.

TECHNICAL FIELD

A technology disclosed in the present teachings relate to a semiconductor device.

BACKGROUND

Japanese Patent Application Publication No. 2016-149715 discloses a semiconductor device in which a switching element and a protection diode are provided in a common semiconductor substrate. A cathode electrode of the protection diode is connected to one of terminals of the switching element. An anode electrode of the protection diode is connected to an external circuit. A potential of the anode electrode of the protection diode varies with a potential of the one terminal of the switching element. A technology in Japanese Patent Application Publication No. 2016-149715 determines whether or not a freewheel diode connected in parallel to the switching element is turned on in accordance with the potential of the anode electrode of the protection diode. When the freewheel diode is turned off, the external circuit permits the switching element to be turned on.

SUMMARY

When the cathode electrode of the diode is connected to one of terminals of a switching element as in the protection diode in Japanese Patent Application Publication No. 2016-149715, a potential of an anode electrode of the diode varies with a potential of the terminal. In a method other than the using method in Japanese Patent Application Publication No. 2016-149715 (i.e., the method of determining whether or not the freewheel diode is turned on) as well, a diode of this type can be used in order to determine an operational state of the switching element based on the potential of the terminal of the switching element. In the following, a diode of this type (which includes the protection diode in Japanese Patent Application Publication No. 2016-149715) is referred to as a sense diode.

If the sense diode and the switching element are provided on a single semiconductor substrate, an upper main electrode and a sense anode electrode can be provided above an upper surface of the semiconductor substrate, and a lower main electrode can be provided below a lower surface of the semiconductor substrate. A p-type anode layer of the sense diode is connected to the sense anode electrode, and an n-type cathode layer of the sense diode is connected to the lower main electrode. The switching element is connected between the upper main electrode and the lower main electrode. In other words, the switching element and the sense diode are connected at the lower main electrode. In other words, the lower main electrode serves as one of terminals of the switching element, and also serves as a cathode electrode of the sense diode. A parasitic capacitance exists between the upper main electrode and the sense anode electrode that are located above the semiconductor substrate. Moreover, a parasitic capacitance also exists between the sense anode electrode located above the semiconductor substrate and the lower main electrode located below the semiconductor substrate.

Figure 12:
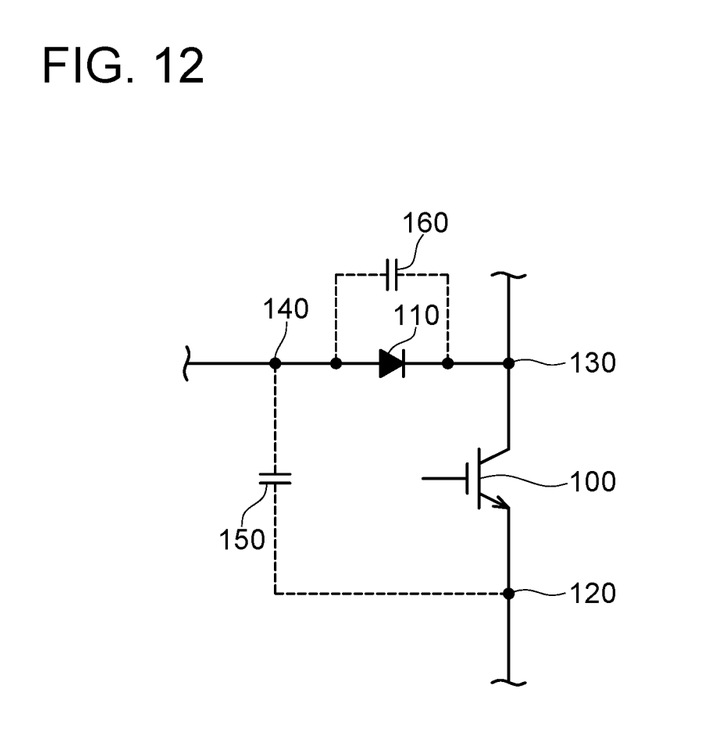
FIG. 12 is a circuit diagram of a semiconductor device including a sense diode.

FIG. 12 illustrates a circuit diagram of this semiconductor device as an example. FIG. 12 illustrates a switching element 100, a sense diode 110, an upper main electrode 120, a lower main electrode 130, a sense anode electrode 140, a parasitic capacitance 150, and a parasitic capacitance 160. Although FIG. 12 shows an IGBT (Insulated Gate Bipolar Transistor) as the switching element 100, the switching element 100 may be another switching element such as a MOSFET (metal-oxide-semiconductor field-effect transistor) or a bipolar transistor. As shown in FIG. 12, the switching element 100 is connected between the upper main electrode 120 and the lower main electrode 130. A cathode layer of the sense diode 110 is connected to the lower main electrode 130, and an anode layer of the sense diode 110 is connected to the sense an de electrode 140. The parasitic capacitance 150 exists between the sense anode electrode 140 and the upper main electrode 120. The parasitic capacitance 160 exists between the sense anode electrode 140 and the lower main electrode 130.

In the semiconductor device in FIG. 12, during an operation of the switching element 100, capacitive coupling via the parasitic capacitance 150 or the parasitic capacitance 160 unintentionally may raise a potential of the sense anode electrode 140 in some cases. The rise in potential of the sense anode electrode 140 due to capacitive coupling may cause an overvoltage to be applied to the sense diode 110. Accordingly, the present disclosure provides a technology of suppressing application of an overvoltage to a sense diode.

A semiconductor device disclosed herein may comprise: a semiconductor substrate; an upper main electrode located above the semiconductor substrate; a sense anode electrode located above the semiconductor substrate; a first resistance layer located above the semiconductor substrate, having resistivity higher than resistivities of the upper main electrode and the sense anode electrode, and connecting the upper main electrode and the sense anode electrode; and a lower main electrode located below the semiconductor substrate. In the semiconductor device the semiconductor substrate may comprise a switching element and a sense diode. The switching element may be connected between the upper main electrode and the lower main electrode, and the sense diode may comprise a p-type first anode region connected to the sense anode electrode and an n-type first cathode region connected to the lower main electrode.

In this semiconductor device, the sense anode electrode is connected to the upper main electrode via the first resistance layer. Therefore, when a potential of the sense anode electrode rises owing to capacitive coupling, a current flows from the sense anode electrode to the upper main electrode via the first resistance layer. This suppresses a further rise in potential of the sense anode electrode. Application of an overvoltage to the sense diode is thus suppressed. Moreover, if resistance between the sense anode electrode and the upper main electrode were extremely low, the potential of the sense anode electrode would be fixed to a potential of the upper main electrode. In contrast to this, in this semiconductor device, the first resistance layer that connects the sense anode electrode and the upper main electrode has the resistivity higher than the resistivities of the upper main electrode and the sense anode electrode. Therefore, the potential of the sense anode electrode is not fixed to the potential of the upper main electrode, and the potential of the sense anode electrode can change. Accordingly, an operational state of the switching element can be determined based on the potential of the sense anode electrode. Therefore, according to this semiconductor device, the switching element can be controlled suitably.

DETAILED DESCRIPTION

Figure 1:
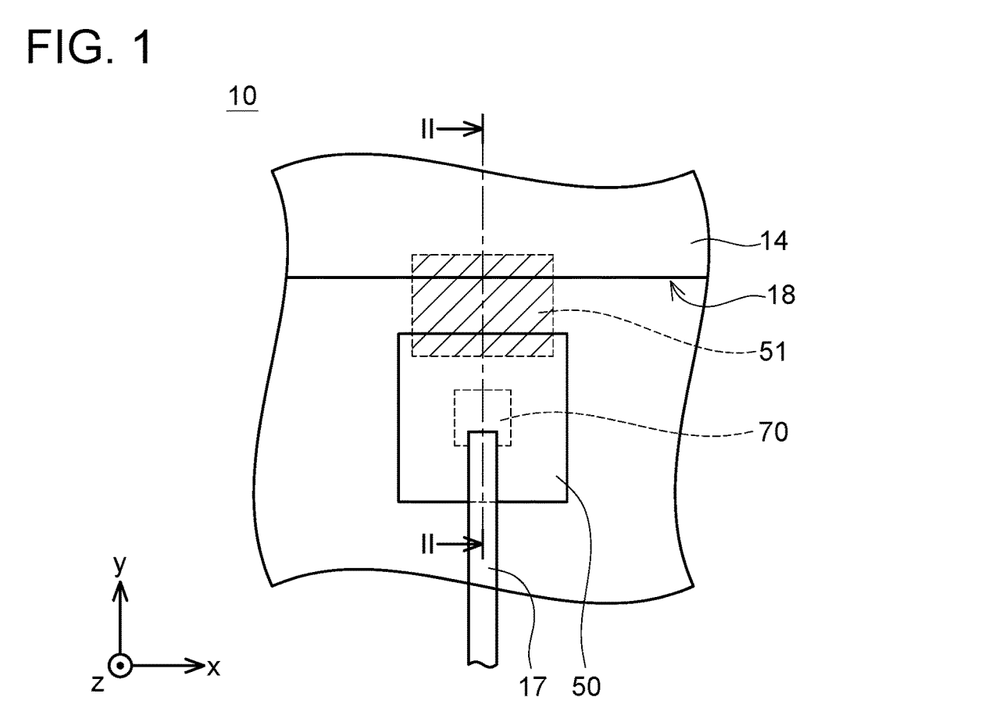
FIG. 1 is a top view of a semiconductor device in an embodiment.
Figure 2:
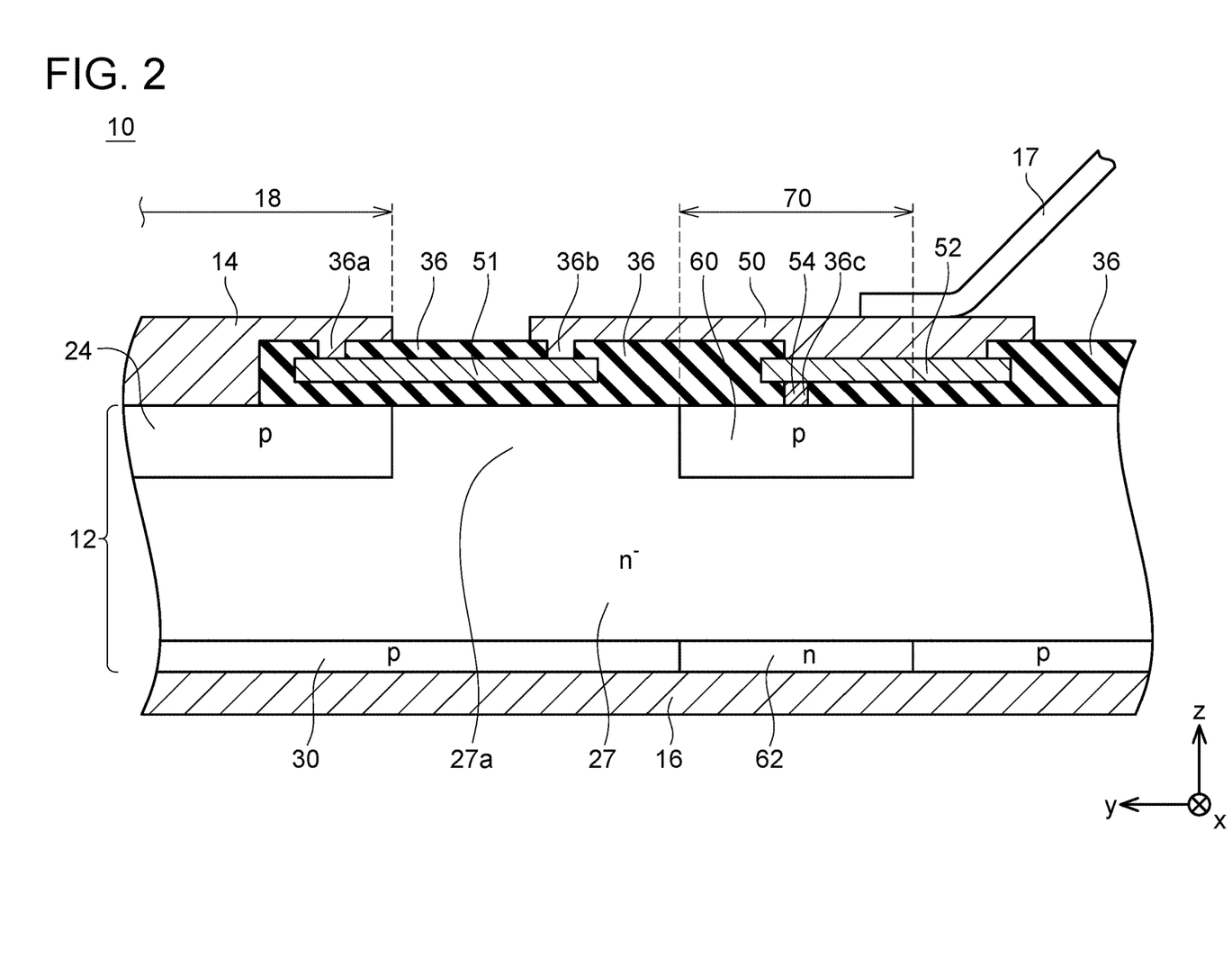
FIG. 2 is a cross-sectional view of the semiconductor device along a line II-II in FIG. 1.
Figure 3:
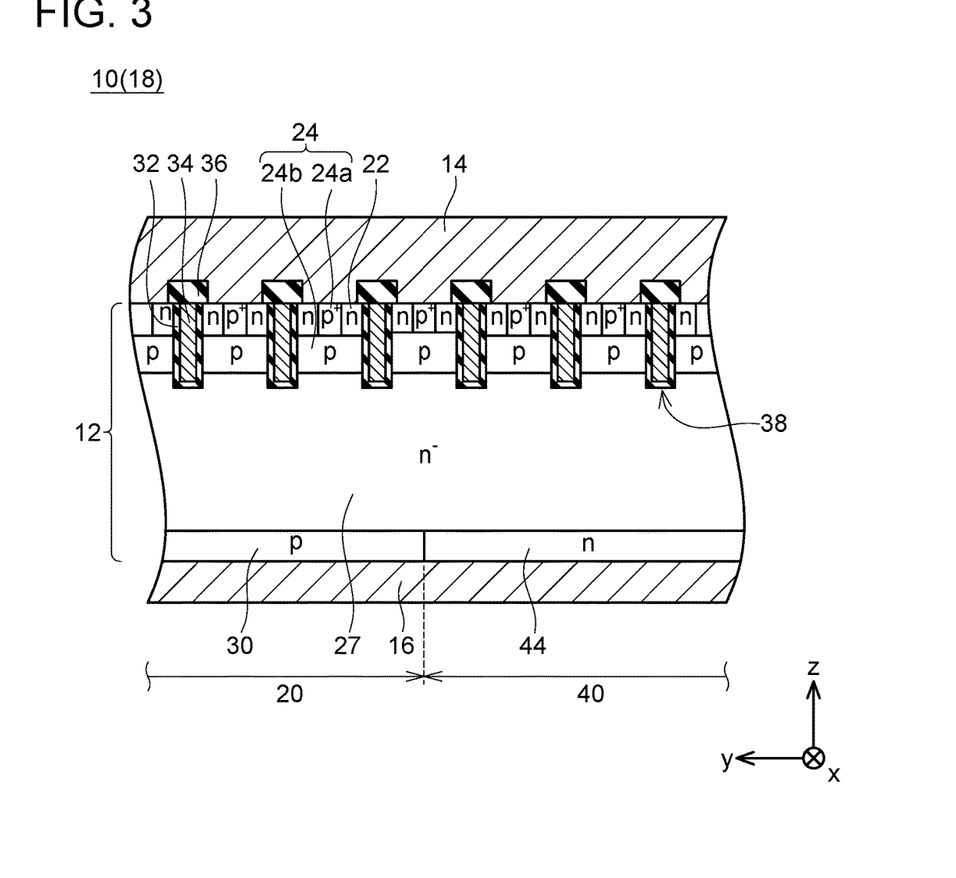
FIG. 3 is a cross-sectional view of the semiconductor device in an element region 18.

FIGS. 1 to 3 each show a semiconductor device 10 in an embodiment. The semiconductor device 10 has a semiconductor substrate 12. The semiconductor substrate 12 is a substrate constituted of silicon. As shown in FIG. 1, an upper main electrode 14 and a sense anode electrode 50 are located above the semiconductor substrate 12. An element region 18 is provided in the semiconductor substrate 12 under the upper main electrode 14. As to be mentioned below in details, an IGBT and a freewheel diode are provided in the element region 18. Moreover, a sense region 70 is provided in the semiconductor substrate 12 under the sense anode electrode 50. As to be mentioned below in details, a sense diode is provided in the sense region 70. The element region 18 has an area much larger than an area of the sense region 70. It should be noted that in the following description, a thickness direction of the semiconductor substrate 12 is referred to as a z direction, one direction parallel to an upper surface of the semiconductor substrate 12 (one direction orthogonal to the z direction) is referred to as an x direction, and a direction orthogonal to the z direction and the x direction is referred to as a y direction.

As shown in FIG. 2, the upper surface of the semiconductor substrate 12 in the sense region 70 is covered with an interlayer insulating film 36. Moreover, the sense anode electrode 50, a second resistance layer 52, and a wiring layer 54 are located above the sense region 70.

The second resistance layer 52 is constituted of polysilicon doped with impurities. The second resistance layer 52 has resistivity higher than resistivities of the sense anode electrode 50 and the wiring layer 54. The second resistance layer 52 is located on the interlayer insulating film 36. A contact hole 36c is provided in the interlayer insulating film 36 below the second resistance layer 52. The wiring layer 54 is located in the contact hole 36c. The wiring layer 54 is constituted of Al (aluminum) or AlSi (an alloy of aluminum and silicon). The wiring layer 54 is in contact with the second resistance layer 52. The wiring layer 54 is in contact with the upper surface of the semiconductor substrate 12. In other words, the second resistance layer 52 is connected to the semiconductor substrate 12 via the wiring layer 54. The sense anode electrode 50 is constituted of Al or AlSi. The sense anode electrode 50 is located on the second resistance layer 52. The sense anode electrode 50 covers an entirety of an upper surface of the second resistance layer 52. An upper surface of the sense anode electrode 50 constitutes a bonding pad. One end of the wire 17 is bonded to the upper surface of the sense anode electrode 50. The other end of the wire 17 is connected to an external circuit.

The second resistance layer 52 and the wiring layer 54 configure a current path that connects the sense anode electrode 50 and the semiconductor substrate 12 (more specifically, an anode region 60 to be mentioned later). As mentioned above, the resistivity of the second resistance layer 52 is higher than the resistivities of the sense anode electrode 50 and the wiring layer 54. Therefore, in the current path from the bonding pad to the semiconductor substrate 12, the resistance of the second resistance layer 52 is higher than resistances of the sense anode electrode 50 and the wiring layer 54.

The upper main electrode 14 is constituted of Al or AlSi. As shown in FIGS. 2 and 3, the upper main electrode 14 is in contact with the upper surface of the semiconductor substrate 12 in the element region 18. As shown in FIG. 2, a spacing is provided between the upper main electrode 14 and the sense anode electrode 50.

As shown in FIG. 2, the upper surface of the semiconductor substrate 12 located between the element region 18 and the sense region 70 is covered with the interlayer insulating film 36. A first resistance layer 51 is located on the interlayer insulating film 36 in this portion. The first resistance layer 51 is constituted of polysilicon doped with impurities. An upper surface of the first resistance layer 51 is covered with the interlayer insulating film 36. Contact holes 36a and 36b are provided in the interlayer insulating film 36 on the first resistance layer 51. The sense anode electrode 50 extends to the contact hole 36b. The sense anode electrode 50 covers the first resistance layer 51 in the contact hole 36b. The upper main electrode 14 extends to the contact hole 36a. The upper main electrode 14 covers the first resistance layer 51 in the contact hole 36a. The sense anode electrode 50 is connected to the upper main electrode 14 via the first resistance layer 51.

As shown in FIGS. 2 and 3, a lower main electrode 16 is located on a lower surface of the semiconductor substrate 12. The lower main electrode 16 is in contact with approximately an entire range of the lower surface of the semiconductor substrate 12.

As shown in FIG. 2, the anode region 60, a drift region 27, and a cathode region 62 are located in the sense region 70.

The anode region 60 is a p-type region. The anode region 60 is located in a range constituting the upper surface of the semiconductor substrate 12. The anode region 60 is located below the wiring layer 54. The anode region 60 is in contact with the wiring layer 54. The anode region 60 is connected to the sense anode electrode 50 via the wiring layer 54 and the second resistance layer 52.

The drift region 27 is an n-type region having a low n-type impurity concentration. The drift region 27 is located below the anode region 60. The resistivity of the second resistance layer 52 may be higher than resistivity of the drift region 27 when no conductivity modulation phenomenon occurs.

The cathode region 62 is an n-type region having an n-type impurity concentration higher than the n-type impurity concentration of the drift region 27. The cathode region 62 is located below the drill region 27 under (directly below) the anode region 60. The cathode region 62 is located in a range constituting the lower surface of the semiconductor substrate 12. The cathode region 62 is in contact with the lower main electrode 16.

In the sense region 70, a sense diode is provided by the anode region 60, the region 27, and the cathode region 62.

As shown in FIG. 3, the element region 18 includes an IGBT range 20 in which an IGBT is provided, and a diode range 40 in which a freewheel diode is provided. The IGBT range 20 and the diode range 40 are adjacent to each other. In the element region 18, the IGBT ranges 20 and the diode ranges 40 are located alternately and repeatedly in the y direction.

A plurality of trenches 38 is provided in the upper surface of the semiconductor substrate 12 in the element region 18. In the upper surface of the semiconductor substrate 12, the plurality of trenches 38 extends parallel along the x direction. In a cross section shown in FIG. 3, each of the trenches 38 extends from the upper surface of the semiconductor substrate 12 along the z direction. I Each of the IGBT range 20 and the diode range 40 includes a plurality of trenches 38 provided therein. An inner surface of each of the trenches 38 is covered with a gate insulating film 32. In each trench 38, a gate electrode 34 is located. Each gate electrode 34 is insulated from the semiconductor substrate 12 by the corresponding gate insulating film 32. An upper surface of each gate electrode 34 is covered with the interlayer insulating film 36. Each gate electrode 34 is insulated from the upper main electrode 14 by the interlayer insulating film 36. Each gate electrode 34 in the IGBT range 20 is connected to a gate wiring not shown. Each gate electrode 34 in the diode range 40 may be connected to a gate wiring, or may be a dummy electrode connected to the upper main electrode 14 or the like.

An emitter region 22 and a p-type region 24 are located in each range interposed between two of the trenches 38. The emitter regions 22 and the p-type region 24 are located in the IGBT range 20 and the diode range 40. Each of the emitter regions 22 is an n-type region. The emitter regions 22 are located in the range constituting the upper surface of the semiconductor substrate 12. The emitter regions 22 are in contact with the upper main electrode 14. Each emitter region 22 is in contact with the corresponding gate insulating film 32 in an upper end portion of the corresponding trench 38. The p-type region 24 has high-concentration regions 24a and a low-concentration region 24b. Each of the high-concentration regions 24a has a p-type impurity concentration higher than a p-type impurity concentration of the low-concentration region 24b. The high-concentration regions 24a are located in the range constituting the upper surface of the semiconductor substrate 12. The high-concentration regions 24a are in contact with the upper main electrode 14. The low-concentration region 24b is located below the high-concentration regions 24a and the emitter regions 22. The low-concentration region 24b is in contact with the gate insulating films 32 below the emitter regions 22. A portion of the p-type region 24 in the IGBT range 20 functions as a body region of the IGBT. Moreover, a portion of the p-type region 24 in the diode range 40 functions as an anode region of the freewheel diode. Although the emitter regions 22 are located in the diode range 40 in FIG. 3, the emitter region 22 may not be located in the diode range 40.

The drift region 27 is located below the p-type region 24 in the IGBT range 20 and the diode range 40. In other words, the drift region 27 spreads out across the sense region 70, the IGBT range 20, and the diode range 40. The drift region 27 is in contact with the gate insulating films 32 below the p-type region 24. The drift region 27 is separated from the emitter regions 22 by the p-type region 24.

A collector region 30 is located below the drift region 27 in each IGBT range 20. The collector region 30 is a p-type region. The collector region 30 is located in the range constituting the lower surface of the semiconductor substrate 12. The collector region 30 is in contact with the lower main electrode 16. The collector region 30 is separated from the p-type region 24 by the drift region 27.

A cathode region 44 is located below the drift region 27 in the diode range 40. The cathode region 44 is an n-type region having an n-type impurity concentration higher than the n-type impurity concentration of the drift region 27. The cathode region 44 is located in the range constituting the lower surface of the semiconductor substrate 12. The cathode region 44 is in contact with the lower main electrode 16.

In the IGBT range 20, an IGBT is constituted of the emitter region 22, the p-type region 24 (i.e., the body region), the drift region 27, the collector region 30, the gate electrode 34, the gate insulating film 32, and the like. If the element region 18 operates as the IGBT, the upper main electrode 14 functions as an emitter electrode, and the lower main electrode 16 functions as a collector electrode.

In the diode range 40, a freewheel diode is constituted of the p-type region 24 (i.e., the anode region), the drift region 27, the cathode region 44, and the like. If the element region 18 functions as the freewheel diode, the upper main electrode 14 functions as an anode electrode, and the lower main electrode 16 functions as a cathode electrode.

As shown in FIG. 2, the drift region 27 spreads out between the element region 18 and the sense region 70. The p-type region 24 (the body region) is separated from the anode region 60 by the drift region 27. In the following, the drift region 27 positioned between the p-type region 24 and the anode region 60 is referred to as a separation region 27a. Resistivity of the first resistance layer 51 may be lower than resistivity of the separation region 27a.

Figure 4:
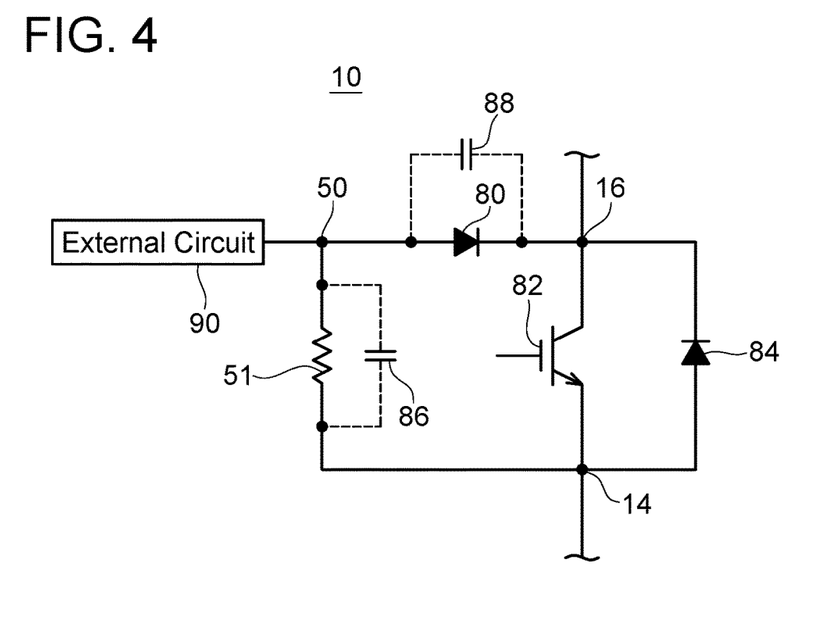
FIG. 4 is a circuit diagram of the semiconductor device in the embodiment.

FIG. 4 shows an internal circuit of the semiconductor device 10. In FIG. 4, an IGBT 82 indicates an IGBT provided in the IGBT range 20, a freewheel diode 84 indicates a freewheel diode provided in the diode range 40, and a sense diode 80 indicates a sense diode provided in the sense region 70. A collector of the IGBT 82 is connected to the lower main electrode 16, and an emitter of the IGBT 82 is connected to the upper main electrode 14. An anode of the freewheel diode 84 is connected to the upper main electrode 14, and a cathode of the freewheel diode 84 is connected to the lower main electrode 16. In other words, the freewheel diode 84 is connected in anti-parallel to the IGBT 82. A cathode of the sense diode 80 is connected to the lower main electrode 16. Moreover, an anode of the sense diode 80 is connected to the sense anode electrode 50. The sense anode electrode 50 is connected to an external circuit 90 via the wire 17 (see FIG. 1) or the like. The external circuit 90 controls a potential of a gate electrode of the IGBT 82 in accordance with a potential of the sense anode electrode 50. The potential of the sense anode electrode 50 varies with a potential of the lower main electrode 16. If the potential of the lower main electrode 16 is equal to or lower than a predetermined value, the sense diode 80 is turned on, and the potential of the sense anode electrode 50 becomes a potential approximately equal to the potential of the lower main electrode 16 (more specifically, a potential higher than the potential of the lower main electrode 16 by a forward voltage drop of the sense diode 80). Moreover, if the potential of the lower main electrode 16 is higher than the predetermined value, the sense diode 80 is turned off. In this case, the potential of the sense anode electrode 50 becomes a potential independent of the potential of the lower main electrode 16 (e.g., a potential determined inside the external circuit 90). Accordingly, the external circuit 90 can sense an operational state of the IGBT 82 by detecting the potential of the sense anode electrode 50. Therefore, the external circuit 90 can suitably control the IGBT 82. Moreover, as shown in FIGS. 1 and 2, the sense anode electrode 50 is located near the upper main electrode 14. Therefore, a parasitic capacitance exists between the sense anode electrode 50 and the upper main electrode 14. FIG. 4 shows this parasitic capacitance as a capacitance 86. Moreover, as shown in FIG. 2, the sense anode electrode 50 and the lower main electrode 16 face each other with the semiconductor substrate 12 interposed therebetween. A parasitic capacitance therefore exists between the sense anode electrode 50 and the lower main electrode 16. FIG. 4 shows this parasitic capacitance as a capacitance 88. Moreover, the sense anode electrode 50 is connected to the upper main electrode 14 by the first resistance layer 51. FIG. 4 shows the first resistance layer 51 as resistor 51.

The potential of the sense anode electrode 50 may varies owing to capacitive coupling via the parasitic capacitances 86 and 88. For example, when a potential of the upper main electrode 14 sharply varies, the potential of the sense anode electrode 50 varies owing to capacitive coupling via the parasitic capacitance 88. Moreover, when the potential of the lower main electrode 16 sharply varies, the potential of the sense anode electrode 50 varies owing to capacitive coupling via the parasitic capacitance 86. When the potential of the sense anode electrode 50 varies owing to capacitive coupling, a high load is placed on the sense diode 80. For example, when the potential of the sense anode electrode 50 excessively rises owing to capacitive coupling, an overvoltage is applied to the sense diode 80 in a forward direction. Therefore, an overcurrent flows in the sense diode 80 in the forward direction. Moreover, while a current flows in the sense diode 80 in the forward direction owing to the rise in potential of the sense anode electrode 50, holes are injected from the anode region 60 into the drift region 27. Subsequently, when the potential of the sense anode electrode 50 decreases, the voltage applied to the sense diode 80 is switched from a forward voltage to a reverse voltage. The holes that exist in the drift region 27 are then discharged into the sense anode electrode 50. A recovery current therefore flows in the sense diode 80. A larger forward current causes a larger recovery current that flows subsequently, and a larger load to be placed on the sense diode 80. Moreover, when the potential of the sense anode electrode 50 excessively rises, an insulating property of the insulating film between the sense anode electrode 50 and the upper main electrode 14 may be degraded.

In contrast to this, in the semiconductor device 10 in the present embodiment, the first resistance layer 51 and the second resistance layer 52 lighten the load to be placed on the sense diode 80. This will hereinafter be described in details.

As mentioned above, the first resistance layer 51 connects the sense anode electrode 50 and the upper main electrode 14. When the potential of the sense anode electrode 50 rises owing to capacitive coupling, a fine current flows from the sense anode electrode 50 to the upper main electrode 14 via the first resistance layer 51. This suppresses a further rise in potential of the sense anode electrode 50. Application of an overvoltage to the sense diode 80 is thereby suppressed. Moreover, degradation of the insulating property of the insulating film between the sense anode electrode 50 and the upper main electrode 14 can be suppressed. It should be noted that when the resistance of the first resistance layer 51 is excessively low, the potential of the sense anode electrode 50 is fixed to the potential of the upper main electrode 14, resulting in that the external circuit 90 can no longer operate normally. In contrast to this, in the present embodiment, the first resistance layer 51 has relatively high resistance. Therefore, the potential of the sense anode electrode 50 can vary independently, to a certain degree, of the potential of the upper main electrode 14. Therefore, the external circuit 90 can appropriately control the IGBT 82 in accordance with the potential of the sense anode electrode 50. The fine current that flows from the sense anode electrode 50 to the upper main electrode 14 does not flow inside the semiconductor substrate 12, but flows in the first resistance layer 51. This suppresses heat generation in the semiconductor substrate 12, and ease stress on the semiconductor substrate 12.

Moreover, as mentioned above, the second resistance layer 52 that has high resistance is located between the sense anode electrode 50 and the anode region 60. Therefore, the forward voltage drop of the sense diode 80 is large. Thus, when a forward voltage is applied, a forward current is less likely to flow in the sense diode 80. This suppresses an overcurrent from flowing in the sense diode 80. Moreover, since a forward current is less likely to flow in the sense diode 80, a recovery current is less likely to flow in the sense diode 80 when the voltage applied to the sense diode 80 is switched from a forward voltage to a reverse voltage.

As described above, in the semiconductor device 10 in the present embodiment, an overvoltage is less likely to be applied to the sense diode 80. Moreover, in the semiconductor device 10 in the present embodiment, an overcurrent and a recovery current are less likely to flow in the sense diode 80. Therefore, the load placed on the sense diode 80 is lightened, and reliability of the sense diode 80 is improved.

It should be noted that a configuration of each member that configures the semiconductor device 10 will hereinafter be described as an example. The drift region 27 may contain phosphorus as impurities, have resistivity of 40 to 100 Ωcm, and have a thickness of 80 to 165 μm. The upper main electrode 14 may have a titanium layer, a nickel layer, and a gold (Au) layer that are arranged on an upper surface of a layer constituted of Al or AlSi, and have a thickness of 3 to 30 μm. The lower main electrode 16 may have a titanium layer, a nickel layer, and a gold layer that are arranged on a lower surface of a layer constituted of Al or AlSi. Alternatively, the lower main electrode 16 may be constituted of a titanium layer, a nickel layer, and a gold layer. The lower main electrode 16 may have a thickness of 1 to 30 μm. The p-type region 24 may contain boron as impurities, have a peak impurity concentration of $1 \times 10^{16}$ to $1 \times 10^{19}$ cm$^{-3}$, and have a thickness of 0.2 to 5.0 μm. The emitter region 22 may contain arsenic or phosphorus as impurities, have a peak impurity concentration of $1 \times 10^{18}$ to $1 \times 10^{21}$ cm$^{-3}$, and have a thickness of 0.2 to 1.5 μm. The cathode region 44 may contain phosphorus as impurities, have a peak impurity concentration of $1 \times 10^{18}$ to $1 \times 10^{21}$ cm$^{-3}$, and have a thickness of 0.2 to 3.0 μm. The collector region 30 may contain boron as impurities, have a peak impurity concentration of $1\times10^{15}$ to $1\times10^{9}$ cm$^{-3}$, and have a thickness of 0.2 to 3.0 μm. The trench 38 can have a depth of 4 to 7 μm. The first resistance layer 51 may have a thickness of 500 to 2000 nm, and have resistivity of $1\times10^{8}$ to $1\times10^{18}$ Ωcm.

It should be noted that excessively high resistance of the first resistance layer 51 causes a large influence of capacitive coupling, whereas excessively low resistance of the first resistance layer 51 causes the potential of the sense anode electrode 50 to be fixed. Therefore, the resistance of the first resistance layer 51 needs to be set to an appropriate value. For example, it is possible to adjust the resistance of the first resistance layer 51 by adjusting the thickness of the first resistance layer 51. Moreover, configurations in FIGS. 5 to 8 may be adopted in order to adjust the resistance of the first resistance layer 51.

Figure 5:
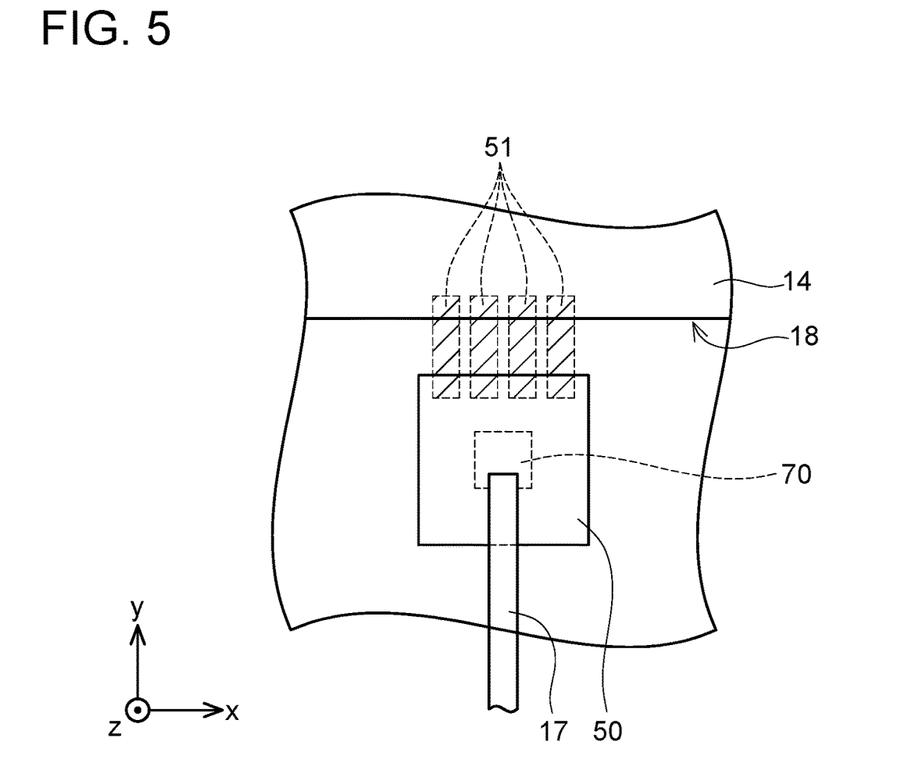
FIG. 5 is a top view of a semiconductor device in a variation, which corresponds to FIG. 1.

In the configuration in FIG. 5, the first resistance layer 51 is divided into a plurality of portions. In the configuration in FIG. 5, a current path of the first resistance layer 51 is narrower than that in the configuration in FIG. 1. Accordingly, the resistance of the first resistance layer 51 can be made high.

Figure 6:
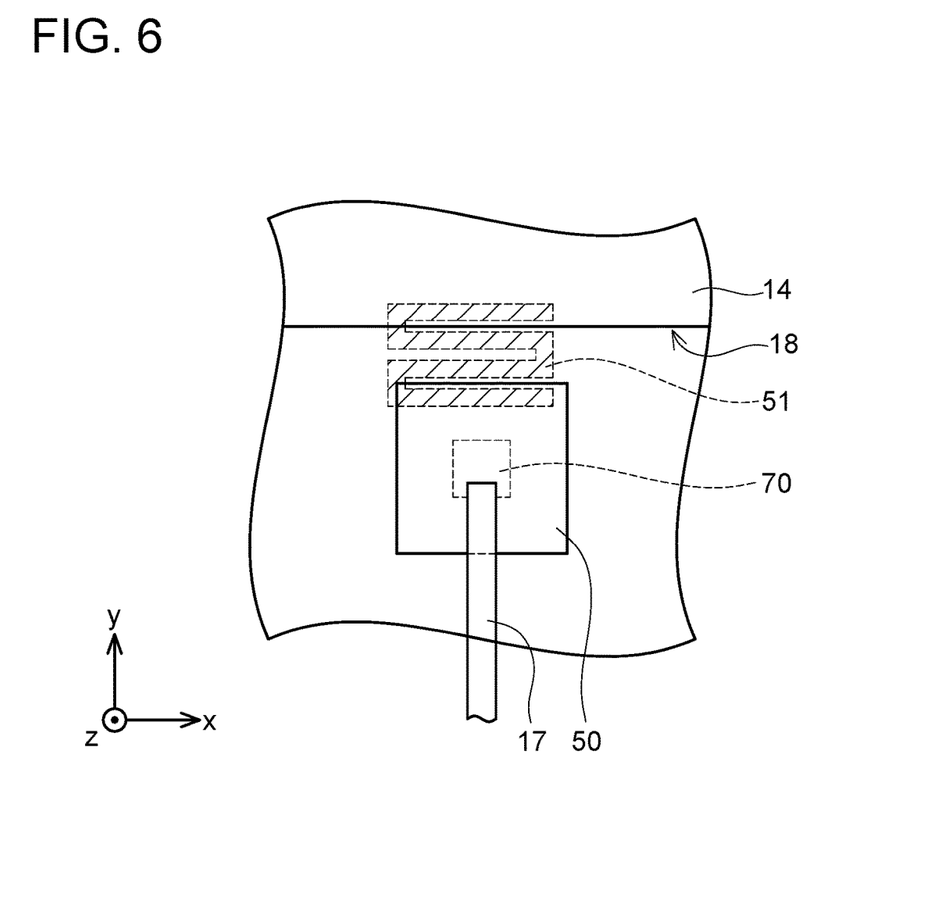
FIG. 6 is a top view of a semiconductor device in a variation, which corresponds to FIG. 1.

In the configuration in FIG. 6, the first resistance layer 51 is serpentine, and is connected to the sense anode electrode 50 and the upper main electrode 14 at its opposite ends. In the configuration in FIG. 6, the current path of the first resistance layer 51 is narrower and longer than that in the configuration in FIG. 1. Accordingly, the resistance of the first resistance layer 51 can be made high.

Figure 7:
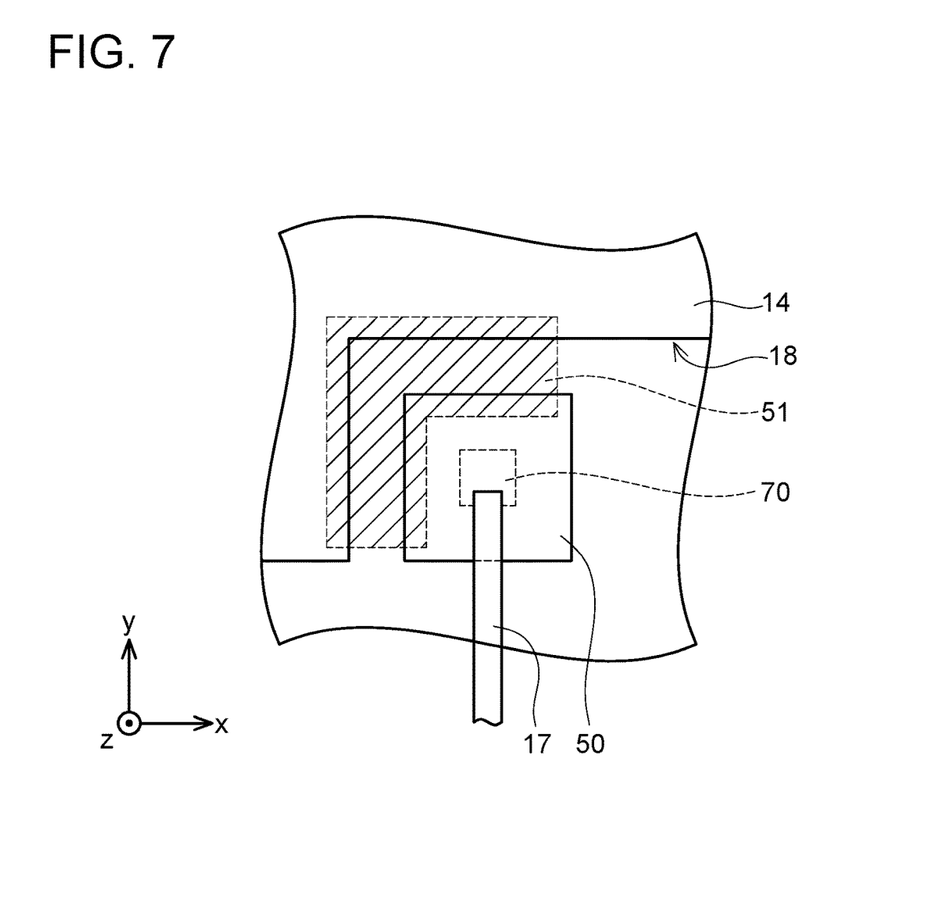
FIG. 7 is a top view of a semiconductor device in a variation, which corresponds to FIG. 1.

In the configuration in FIG. 7, the upper main electrode 14 is adjacent to the sense anode electrode 50 at two adjacent sides of a contour of the sense anode electrode 50. The first resistance layer 51 connects the sense anode electrode 50 to the upper main electrode 14 at these two sides. In the configuration in FIG. 7, the current path of the first resistance layer 51 is wider than that in the configuration in FIG. 1. Accordingly, the resistance of the first resistance layer 51 can be made low.

Figure 8:
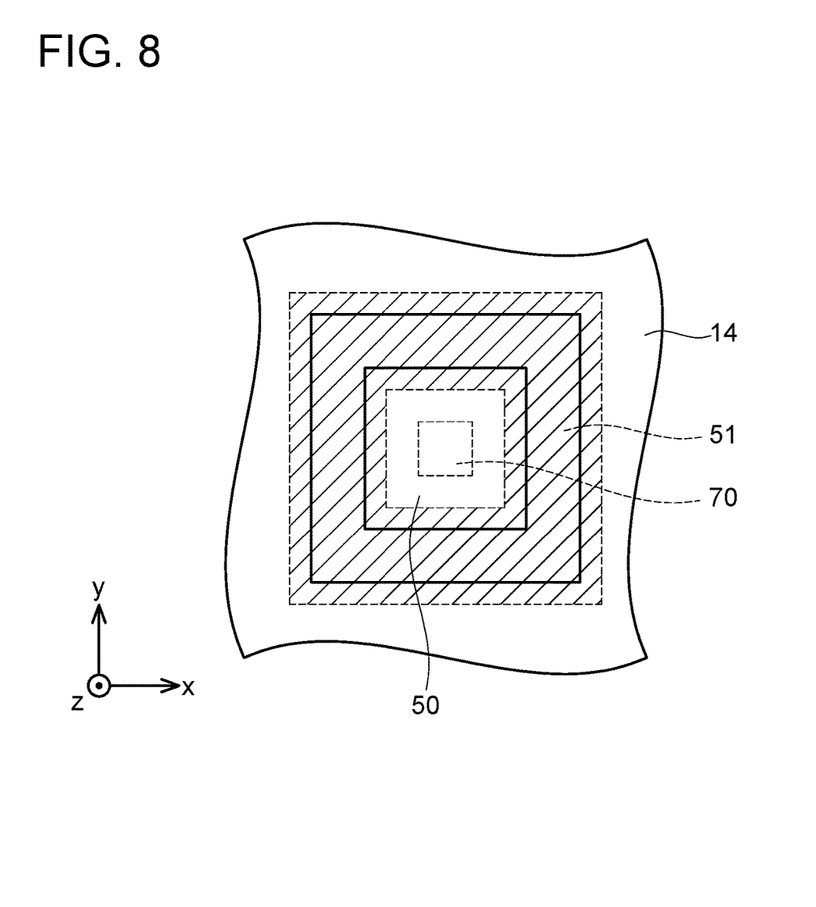
FIG. 8 is a top view of a semiconductor device in a variation, which corresponds to FIG. 1.

In the configuration in FIG. 8, the sense anode electrode 50 is surrounded by the upper main electrode 14. The first resistance layer 51 connects the sense anode electrode 50 and the upper main electrode 14 at an entire periphery of the sense anode electrode 50. In the configuration in FIG. 8, the current path of the first resistance layer 51 is wider than that in the configuration in FIG. 1. Accordingly, the resistance of the first resistance layer 51 can be made low. The wire 17 is not shown in FIG. 8.

Figure 9:
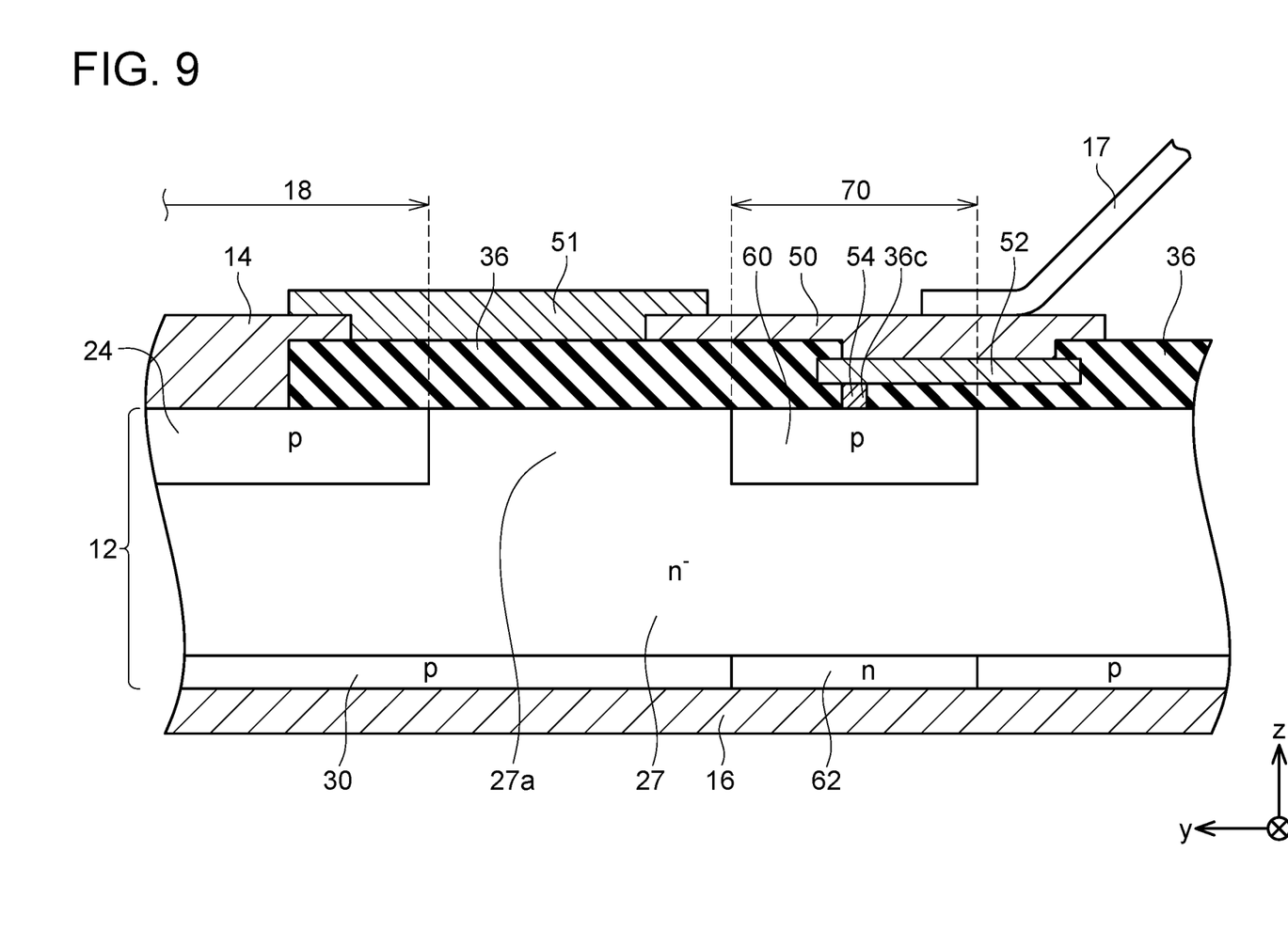
FIG. 9 is a cross-sectional view of a semiconductor device in a variation, which corresponds to FIG. 2.

Moreover, in the embodiment mentioned above, the upper main electrode 14 covers a part of the upper surface of the first resistance layer 51 (a portion where the contact hole 36a exists), and the sense anode electrode 50 covers a part of the upper surface of the first resistance layer 51 (a portion where the contact hole 36b exists). However, as shown in FIG. 9, the first resistance layer 51 may cover a part of an upper surface of the upper main electrode 14 and a part of the upper surface of the sense anode electrode 50.

Figure 10:
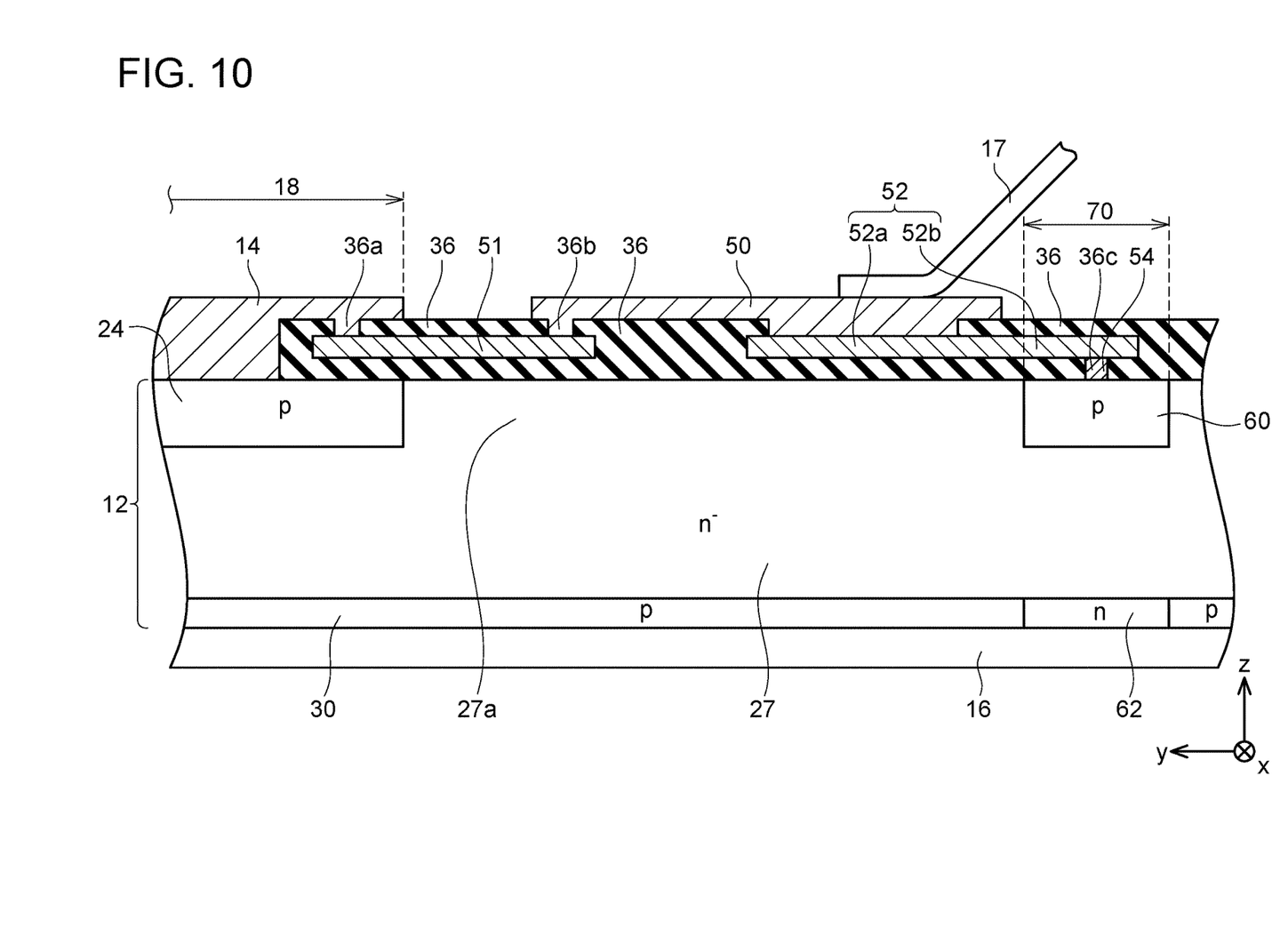
FIG. 10 is a cross-sectional view of a semiconductor device in a variation, which corresponds to FIG. 2.

Moreover, in the embodiment mentioned above, the anode region 60 is located under the bonding pad the sense anode electrode 50). However, as shown in FIG. 10, the anode region 60 may not be located under the bonding pad, and may be located outside the bonding pad. In this case, the second resistance layer 52 may have a portion 52a positioned under the bonding pad and a portion 52b extracted from the portion 52a to outside of the bonding pad. The anode region 60 may be connected to the sense anode electrode 50 via the portion 52b of the second resistance layer 52. According to this configuration, an impact at wire bonding is less likely to be applied to the anode region 60. This can suppress a defect or the like from occurring in the anode region 60. Therefore a leakage current or the like in the sense diode 80 can be suppressed. Moreover, since the second resistance layer 52 constituted of polysilicon is located under the bonding pad, the semiconductor substrate 12 can be protected by the polysilicon layer at wire bonding. This can reduce damage to the semiconductor substrate 12 at wire bonding.

Figure 11:
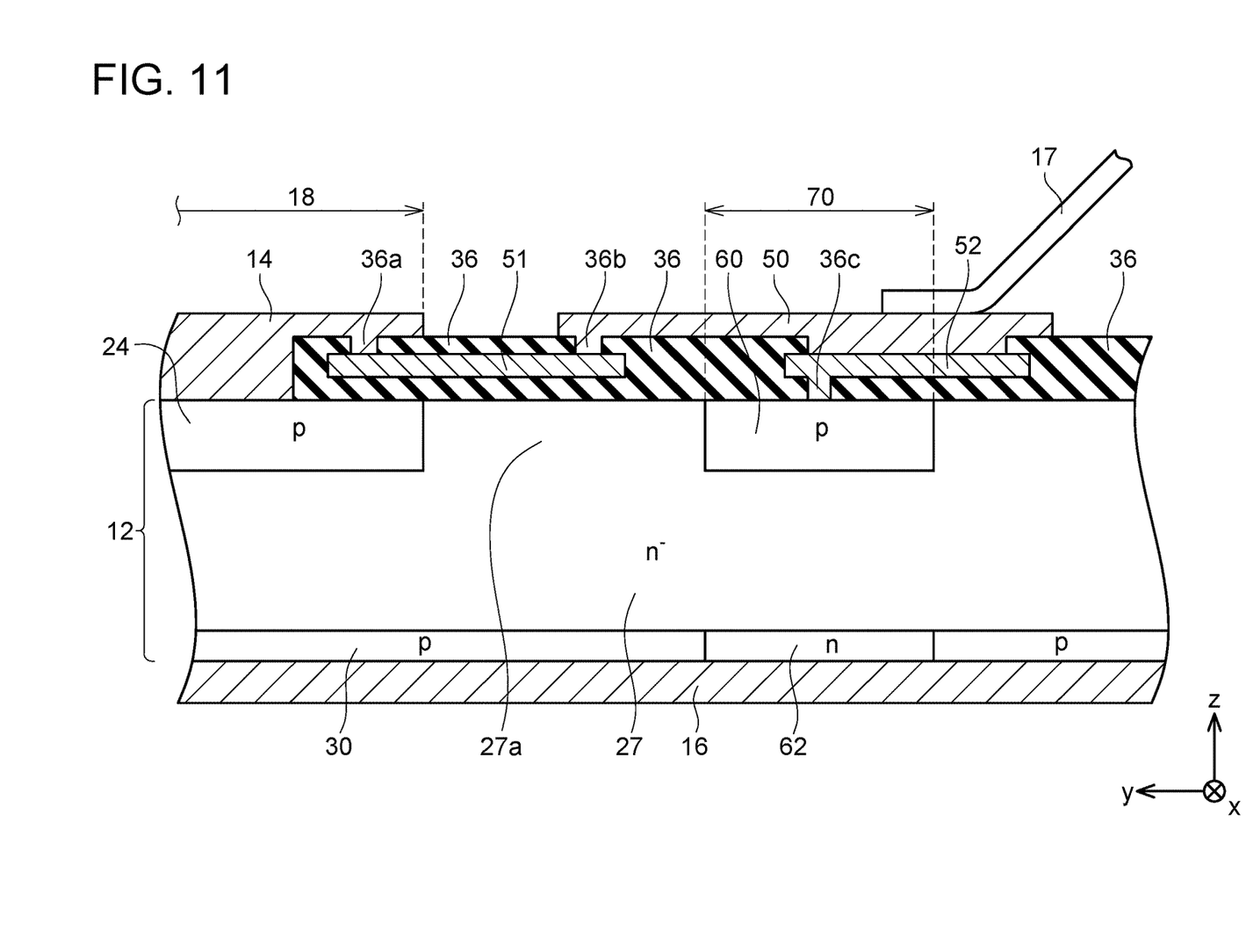
FIG. 11 is a cross-sectional view of a semiconductor device in a variation, which corresponds to FIG. 2.

Moreover, in the embodiment mentioned above, the second resistance layer 52 is connected to the semiconductor substrate 12 (i.e., the anode region 60) via the wiring layer 54. However, as shown in FIG. 11, the second resistance layer 52 may be in direct contact with the semiconductor substrate 12. In this case, the second resistance layer 52 may be particularly constituted of polysilicon. In a configuration shown in FIG. 11, if the second resistance layer 52 is constituted of polysilicon, holes flow from the anode region 60 into the second resistance layer 52 when a reverse voltage is applied to the sense diode 80. Carriers in polysilicon have a short life time. Therefore, when the holes flow in the second resistance layer 52, many of the holes disappear owing to recombination. A recovery current can further be reduced.

Moreover, in the embodiment mentioned above, the first resistance layer 51 and the second resistance layer 52 are constituted of polysilicon. By regulating an impurity concentration in the polysilicon, it is possible to easily regulate the resistivity of the polysilicon. Accordingly, each of the resistivities of the first resistance layer 51 and the second resistance layer 52 is easily regulated to desired resistivity. Moreover, the first resistance layer 51 may be constituted of a SInSiN (semi-insulating silicon nitride) film. The SInSiN film may be provided at an upper surface of a semiconductor substrate to serve as a protection film for protecting a surface of the semiconductor substrate, or stabilizing an electric field inside the semiconductor substrate. If the first resistance layer 51 is constituted of a SInSiN film, the first resistance layer 51 and the SInSiN film that serves as a protection film can be formed at one time. As shown in FIG. 9, if the first resistance layer 51 is located above the upper main electrode 14 and the sense anode electrode 50, and the first resistance layer 51 is constituted of the SInSiN film, the semiconductor device 10 may be manufactured as follows. Initially, the upper main electrode 14 and the sense anode electrode 50 are formed. Next, a SInSiN film is formed at a surface of the semiconductor substrate. Next, the SInSiN film is patterned. At this time, the SInSiN film is allowed to remain at a site required for each of a protection film and the first resistance layer 51. According to this method, the protection film and the first resistance layer 51 can be formed at one time.

Moreover, the first resistance layer 51 and the second resistance layer 52 may be constituted of a same material or may be constituted of different materials. It should be noted that, if the first resistance layer 51 and the second resistance layer 52 are constituted of the same material, the first resistance layer 51 and the second resistance layer 52 can be formed at one time at a manufacturing step. In this case, the resistivity of the first resistance layer 51 becomes approximately equal to the resistivity of the second resistance layer 52.

Moreover, in the embodiment mentioned above, the IGBT is provided in the element region 18. However, in place of the IGBT, another switching element such as a MOSFET may be provided in the element region 18.

Moreover, in the embodiment mentioned above, an entirety of the upper surface of the sense anode electrode 50 is the bonding pad. However, a part of the upper surface of the sense anode electrode 50 may be the bonding pad.

A relationship between a component of the embodiment mentioned above and a component in the claims will be described. The anode region 60 in the embodiment is an example of a first anode region in the claims. The cathode region 62 in the embodiment is an example of a first cathode region in the claims. The p-type region 24 in the diode range 40 in the embodiment is an example of a second anode region in the claims. The cathode region 44 in the embodiment is an example of a second cathode region in the claims.

The technical features disclosed in the present teachings will be listed as below. It should be noted that each of the following features is useful independently of each other.

In one example of the semiconductor device disclosed herein, the switching element may comprise a p-type body region connected to the upper main electrode. Moreover, the semiconductor substrate may comprise an n-type separation region separating the body region from the first anode region. The resistivity of the first resistance layer may be lower than resistivity of the separation region.

According to this configuration, the resistance between the sense anode electrode and the upper main electrode can be made low. This can more effectively suppress application of an overvoltage to the sense diode.

In one example of the semiconductor device disclosed herein, the first resistance layer may cover a part of an upper surface of the upper main electrode and a part of an upper surface of the sense anode electrode.

In one example of the semiconductor device disclosed herein, the upper electrode may cover a part of an upper surface of the first resistance layer. Moreover, the sense anode electrode may cover a part of the upper surface of the first resistance layer.

In one example of the semiconductor device disclosed herein, the first resistance layer may be constituted of polysilicon.

According to this configuration, it is possible to regulate the resistivity of the first resistance layer by regulating an impurity concentration in the polysilicon.

In one example of the semiconductor device disclosed herein, the semiconductor device may further comprise a second resistance layer located above the semiconductor substrate and have resistivity higher than the resistivity of the sense anode electrode. The first anode region may be connected to the sense anode electrode via the second resistance layer.

According to this configuration, a current is less likely to flow in the sense diode. Accordingly a forward current and a recovery current in the sense diode can be suppressed.

In one example of the semiconductor device comprising the second resistance layer, the sense anode electrode may comprise a bonding pad configured so that a wire is bonded to the bonding pad. The second resistance layer may comprise a first portion connected to the sense anode electrode under the bonding pad and a second portion extending outward from the bonding pad. The first anode region may not be located under the bonding pad and may be connected to the sense anode electrode via the second portion.

According to this configuration, an impact at wire bonding is less likely to be applied to the first anode region, and a defect to be caused in the first anode region can be suppressed.

In one example of the semiconductor device disclosed herein, the second resistance layer may be constituted of polysilicon.

It is possible to protect the semiconductor substrate from an impact at wire bonding by locating the polysilicon, which is tolerant of an impact, under the bonding pad.

In one example of the semiconductor device comprising the second resistance layer, the semiconductor device may further comprise a wiring layer located above the semiconductor substrate, being in contact with the first anode region, and having resistivity lower than the resistivity of the second resistance layer. The first anode region may be connected to the second resistance layer via the wiring layer.

In another example of the semiconductor device comprising the second resistance layer, the first anode region may be in direct contact with the second resistance layer. In this case, the second resistance layer may be constituted of polysilicon.

Carriers in polysilicon have a short life time. In this configuration, holes discharged from the semiconductor substrate to the sense anode electrode when a reverse voltage is applied to the sense diode pass through the second resistance layer constituted of polysilicon. Therefore, the holes easily disappear in the second resistance layer owing to recombination. This can further suppress a recovery current.

In one example of a configuration comprising the second resistance layer, the semiconductor substrate may comprise an n-type drift region located between the first anode region and the first cathode region and have an n-type impurity concentration lower than an n-type impurity concentration of the first cathode region. The resistivity of the second resistance layer may be higher than resistivity of the drift region.

According to this configuration, a recovery current in the sense diode can further be suppressed.

In one example of a configuration disclosed herein, the semiconductor substrate may further comprise a freewheel diode. The freewheel diode may comprise a p-type second anode region connected to the upper main electrode and an n-type second cathode region connected to the lower main electrode.

While specific examples of the present invention have been described above in detail, these examples are merely illustrative and place no limitation on the scope of the patent claims. The technology described in the patent claims also encompasses various changes and modifications to the specific examples described above. The technical elements explained in the present description or drawings provide technical utility either independently or through various combinations. The present invention is not limited to the combinations described at the time the claims are filed. Further, the purpose of the examples illustrated by the present description or drawings is to satisfy multiple objectives simultaneously, and satisfying any one of those objectives gives technical utility to the present invention.

What is claimed is:

1. A semiconductor device, comprising:
   a semiconductor substrate;
   an upper main electrode located above the semiconductor substrate;
   a sense anode electrode located above the semiconductor substrate;
   a first resistance layer located above the semiconductor substrate, having resistivity higher than resistivities of the upper main electrode and the sense anode electrode, and connecting the upper main electrode and the sense anode electrode; and
   a lower main electrode located below the semiconductor substrate, wherein the semiconductor substrate comprises a switching element and a sense diode, the switching element is connected between the upper main electrode and the lower main electrode, and the sense diode comprises a p-type first anode region connected to the sense anode electrode and an n-type first cathode region connected to the lower main electrode.

2. The semiconductor device of claim 1, wherein the switching element comprises a p-type body region connected to the upper main electrode, the semiconductor substrate comprises an n-type separation region separating the body region from the first anode region, and the resistivity of the first resistance layer is lower than resistivity of the separation region.

3. The semiconductor device of claim 1, wherein the first resistance layer covers a part of an upper surface of the upper main electrode and a part of an upper surface of the sense anode electrode.

4. The semiconductor device of claim 1, wherein the upper main electrode covers a part of an upper surface of the first resistance layer, and the sense anode electrode covers a part of the upper surface of the first resistance layer.

5. The semiconductor device of claim 1, wherein the first resistance layer is constituted of polysilicon.

6. The semiconductor device of claim 1, further comprising a second resistance layer located above the semiconductor substrate and having resistivity higher than the resistivity of the sense anode electrode, wherein the first anode region is connected to the sense anode electrode via the second resistance layer.

7. The semiconductor device of claim 6, wherein the sense anode electrode comprises a bonding pad configured so that a wire is bonded to the bonding pad, the second resistance layer comprises a first portion connected to the sense anode electrode under the bonding pad and a second portion extending outward from the bonding pad, and the first anode region is not located under the bonding pad, and is connected to the sense anode electrode via the second portion.

8. The semiconductor device of claim 7, wherein the second resistance layer is constituted of polysilicon.

9. The semiconductor device of claim 6, further comprising a wiring layer located above the semiconductor substrate, being in contact with the first anode region, and having resistivity lower than the resistivity of the second resistance layer, wherein the first anode region is connected to the second resistance layer via the wiring layer.

10. The semiconductor device of claim 6, wherein the first anode region is in contact with the second resistance layer.

11. The semiconductor device of claim 10, wherein the second resistance layer is constituted of polysilicon.

12. The semiconductor device of claim 6, wherein the semiconductor substrate comprises an n-type drift region located between the first anode region and the first cathode region and having an n-type impurity concentration lower than an n-type impurity concentration of the first cathode region, and the resistivity of the second resistance layer is higher than resistivity of the drift region.

13. The semiconductor device of claim 1, wherein the semiconductor substrate further comprises a freewheel diode, and the freewheel diode comprises a p-type second anode region connected to the upper main electrode and n-type second cathode region connected to the lower main electrode.

* * * * *